(12) United States Patent
Tsutsui

(10) Patent No.: US 6,534,410 B2
(45) Date of Patent: Mar. 18, 2003

(54) METHOD FOR FORMING CONDUCTOR MEMBERS, MANUFACTURING METHOD OF SEMICONDUCTOR ELEMENT AND MANUFACTURING METHOD OF THIN-FILM MAGNETIC HEAD

(75) Inventor: Tomohiro Tsutsui, Tokyo (JP)

(73) Assignee: TDK Corporation, Tokyo (JP)

( * ) Notice: Subject to any disclaimer, the term of this patent is extended or adjusted under 35 U.S.C. 154(b) by 2 days.

(21) Appl. No.: 09/802,913

(22) Filed: Mar. 12, 2001

(65) Prior Publication Data
US 2001/0027013 A1 Oct. 4, 2001

(30) Foreign Application Priority Data
Mar. 31, 2000 (JP) .......................... 2000-097033

(51) Int. Cl.$^7$ ............................. H01L 21/311
(52) U.S. Cl. ............... 438/702; 438/678; 438/780; 430/312
(58) Field of Search ................. 438/674, 678, 438/670, 671, 614, 52.3, 675, 695, 700, 702, 703, 780, 947, 950; 216/37, 55

(56) References Cited

U.S. PATENT DOCUMENTS

| | | | | |
|---|---|---|---|---|
| 4,413,051 A | * | 11/1983 | Thomas | 430/312 |
| 4,615,782 A | * | 10/1986 | Namatsu et al. | 204/192.36 |
| 5,879,577 A | * | 3/1999 | Weng et al. | 216/92 |
| 6,187,513 B1 | * | 2/2001 | Katakura | |
| 6,340,635 B1 | * | 1/2002 | Toyota et al. | 438/670 |

FOREIGN PATENT DOCUMENTS

JP  10-124826  5/1998

* cited by examiner

Primary Examiner—Olik Chaudhuri
Assistant Examiner—Julio J. Maldonado
(74) Attorney, Agent, or Firm—Oblon, Spivak, McClelland, Maier & Neustadt, P.C.

(57) ABSTRACT

A method for forming conductor members includes a step of coating an organic solvent on a conductive film to form an organic solvent layer, a step of coating a resist material on the organic solvent layer to form a resist layer, a step of patterning the resist layer to form a patterned resist layer, and a step of plating a conductive material using the patterned resist layer to form the conductor members.

10 Claims, 2 Drawing Sheets

METHOD FOR FORMING CONDUCTOR MEMBERS, MANUFACTURING METHOD OF SEMICONDUCTOR ELEMENT AND MANUFACTURING METHOD OF THIN-FILM MAGNETIC HEAD

FIELD OF THE INVENTION

The present invention relates to a method for forming conductor members such as electrodes by plating, to a manufacturing method of a semiconductor element using the conductor members forming method and to a manufacturing method of a thin-film magnetic head.

DESCRIPTION OF THE RELATED ART

In general, conductor members such as electrodes formed on a substrate should have a thickness larger than a thickness of elements formed on the substrate because required are the conductor members to be exposed at a position higher than the elements.

In order to fabricate such thick conductor members by plating, generally, a photoresist material for thick-film is first coated by a low-speed spin coating method, the coated photoresist is patterned by exposure and development, and thereafter plating is executed to form the conductor member pattern.

However, since such photoresist material for thick-film has a high viscosity, it is difficult to completely fill unevenness formed on a conductive film with the photoresist material, namely the photoresist material has a low wettability, causing air bubbles to remain in the unevenness portion. Such air bubbles may deform the resist pattern resulting a poor shape in plated conductor members to be provided.

Japanese patent publication No.10124826A discloses a method for preventing such air bubbles from producing by coating first a low viscosity resist material on a conductive film and then by coating a high viscosity resist material on the coated low viscosity resist material.

According to this conventional method, however, it is necessary to use a plurality kinds of resist material with different viscosities and also to coat them under different coating conditions causing the coating process to complicate.

SUMMARY OF THE INVENTION

It is therefore an object of the present invention to provide a method for forming conductor members, a manufacturing method of a semiconductor element and a manufacturing method of a thin-film magnetic head, whereby conductor members can be formed in a good and desired shape only by adding a very simple process.

According to the present invention, a method for forming conductor members includes a step of coating an organic solvent on a conductive film to form an organic solvent layer, a step of coating a resist material on the organic solvent layer to form a resist layer, a step of patterning the resist layer to form a patterned resist layer, and a step of plating a conductive material using the patterned resist layer to form the conductor members.

Also, according to the present invention, a method for forming conductor members includes a step of coating an organic solvent on a conductive film to form an organic solvent layer, coating a resist material on the organic solvent layer to form a first resist layer, coating a resist material on the first resist layer to form a second resist layer, patterning the first and second resist layers to form a patterned resist layers, and plating a conductive material using the patterned resist layers to form the conductor members. Furthermore, according to the present invention, a manufacturing method of a semiconductor element or a thin-film magnetic head includes a step of forming electrodes using the above-mentioned conductor members forming method.

Just after forming the organic solvent layer on the conductive film, a resist material is coated. Thus, the interface part with the organic solvent layer of the resist layer melts partially, and the melted portion serves as a low viscosity resist which enters into the unevenness of the conductive film so as to fill its level difference. Therefore, no air will remain in the unevenness to prevent air bubbles from generation and as a result no deformation of the resist layer will occur. In addition, this advantage can be obtained only by adding a very simple process for coating the organic solvent resulting that the manufacturing process will not become complicated.

It is preferred that an edge portion of the first resist layer is removed by an edge rinse method before the second resist layer is formed, and that an edge portion of the second resist layer is removed by the edge rinse method before the plating. In this case, it is more preferred that a width of the removed edge portion of the first resist layer is larger than a width of the removed edge portion of the second resist layer.

In general, if a photoresist material for thick-film is spin-coated, the resist material returns in the direction of the center from the edge of the wafer due to surface tension, and therefore a projection of the resist layer is formed on the perimeter or edge portion of the wafer. This projection will prevent to bring the conductive film of the wafer intimate contact with the plating electrode. Thus, electrical conduction between the plating electrode and the conductive film becomes unstable and therefore stable plating cannot be expected.

Although it is possible to simultaneously remove the projections of the first and second resist layers on the wafer by the edge rinse method, if the width of the projections is wide, the removed area will become large and therefore the region for forming the elements on the wafer will becomes small causing a utilization efficiencies of the wafer to reduce.

However, if the second resist layer is formed after the edge portion of the formed first resist layer is removed by the edge rinse, the projection of the second resist layer is formed on the wafer where no first resist layer is remained due to the edge rinse. Thus, the height of the projection of the resist layer becomes very low. Furthermore, if the edge rinse of the second resist layer is performed such that the width of the removed area is smaller than the width of the removed area of the first resist layer, an extremely low projection height can be expected without increasing the whole width of the removed area of the resist layers. As a result, stable electrical conduction between the plating electrode and the conductive film can be obtained and thus plating of conductive material can be attained at a stable plating rate without narrowing the region for forming the elements.

It is preferred that the organic solvent is composed of a solvent component of the resist material. Since the solvent component of the resist material has a relatively low volatile and a relatively high viscosity, using of this as for the organic solvent is very desirable. Also, this solvent component of the resist material has a sufficient affinity for the resist material.

Further objects and advantages of the present invention will be apparent from the following description of the preferred embodiments of the invention as illustrated in the accompanying drawings.

DESCRIPTION OF THE PREFERRED EMBODIMENTS

FIGS. 1a to 1i illustrate processes of conductor members forming method in a preferred embodiment according to the present invention.

Figure 1A:
FIGS. 1a to 1i are sectional views illustrating processes of conductor members forming method in a preferred embodiment according to the present invention.

As shown in FIG. 1a, a conductive film 11 is deposited on an wafer 10 by sputtering for example. Although, in the figure, it is shown that the top surface of the wafer 10 is flat, various elements and layers including electrodes with which the formed conductive film is electrically connected have been formed on the wafer 10. The aforementioned conductive film 11 is deposited on such non-flat top surface of the wafer 10.

Figure 1B:
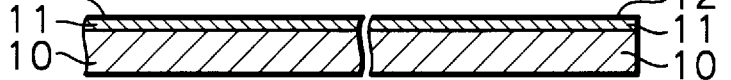

Then, as shown in FIG. 1b, an organic solvent is dropped on the conductive film 11 and uniformly coated on the film 11 by slowly rotating the wafer to form an organic solvent layer 12, in other words, the dropped organic solvent is spin-coated on the conductive film 11 to form the organic solvent layer 12.

As for the organic solvent, it is preferred to use a solvent component of the resist material used. This is because the solvent component of the resist material has a relatively low volatile and a relatively high viscosity. In addition, this solvent component of the resist material has a sufficient affinity for the resist material. Specifically, for example, PGMEA (propylene glycol monomethyl ether acetate), ECA (2-ethoxyethyl acetate), EL (ethyl lactate) or else may be used. However, any solvent with a relatively low volatile and a relatively high viscosity can be used as the organic solvent 12 other than the solvent component of the resist material.

Figure 1C:
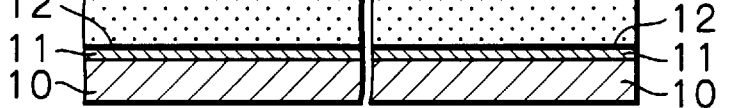

As shown in FIG. 1c, just after forming the organic solvent layer 12, a resist material is dropped on the layer 12 and the dropped resist material is spin-coated on the conductive film 11 to form a first resist layer 13. Thus, the interface part with the organic solvent layer 12 of the first resist layer 13 melts partially, and the melted portion serves as a low viscosity resist which enters into the unevenness of the conductive film 11 so as to fill its level difference. Therefore, no air will remain in the unevenness to prevent air bubbles from generation and as a result no deformation of the first resist layer 13 will occur.

After forming the first resist layer 13, a pre-baking process is executed. Thus, an excessive remaining solvent volatilizes.

It should be noted that if the first resist layer 13 is formed by spin-coating, the resist material returns in the direction of the center from the edge of the wafer 10 due to surface tension, and therefore a projection 13a of the first resist layer 13 is formed on the perimeter or edge portion of the wafer 10 as shown in FIG. 1c.

Figure 1D:
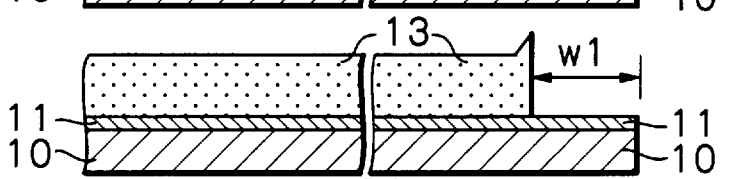

Then, as shown in FIG. 1d, a part of the first resist layer 13 at the edge portion of the wafer, corresponding to the projection 13a is removed by an edge rinse method. More concretely, a solvent for the resist material such as a thinner is dropped on the edge portion of the resist layer 13 while rotating the wafer 10 at low speed, so that only the perimeter portion of the resist layer 13 is dissolved and removed. Thus, the first resist layer 13 within a perimeter area with a width of w1 from the wafer edge is removed.

Figure 1E:
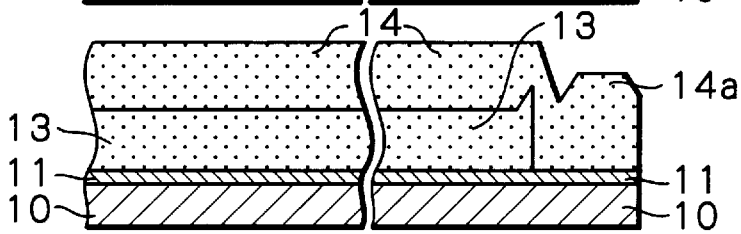

Thereafter, as shown in FIG. 1e, a resist material is dropped on the first resist layer 13 and the dropped resist material is spin-coated to form a second resist layer 14. In this case, also, a projection 14a of the second resist layer 14 is formed on the perimeter or edge portion of the wafer 10. After forming the second resist layer 14, a pre-baking process is also executed.

Figure 1F:
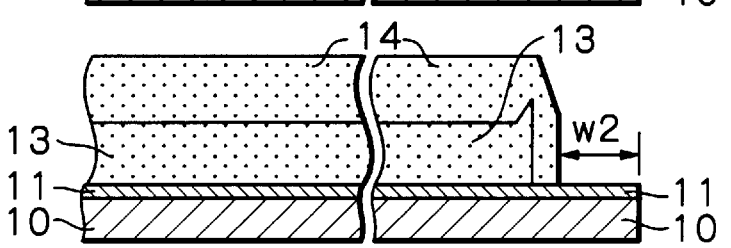

Then, as shown in FIG. 1f, a part of the second resist layer 14 at the edge portion of the wafer, corresponding to the projection 14a is removed by an edge rinse method. More concretely, a solvent for the resist material such as a thinner is dropped on the edge portion of the resist layer 14 while rotating the wafer at low speed, so that only the perimeter portion of the resist layer 14 is dissolved and removed. Thus, the second resist layer 14 within a perimeter area with a width of w2 from the wafer edge is removed. The width w2 is determined as w2<w1.

Figure 1G:
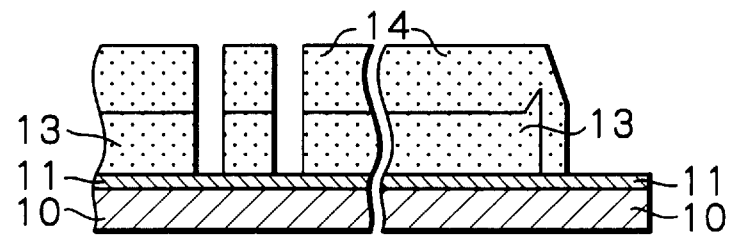

Thereafter, as shown in FIG. 1g, the first and second resist layers 13 and 14 are patterned by exposure using a mask and by development.

Figure 1H:
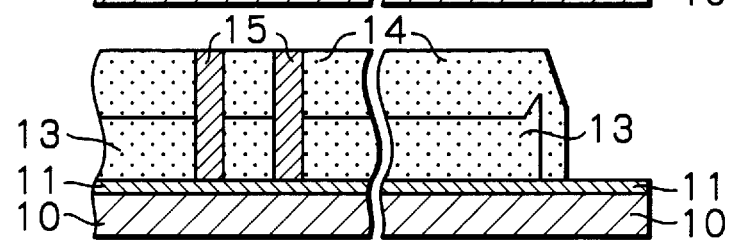

Then, the wafer 10 with thus patterned resist layers 13 and 14 is attached to a plating device and plating of conductive material is executed to form conductor members 15 as shown in FIG. 1h.

Figure 2A:
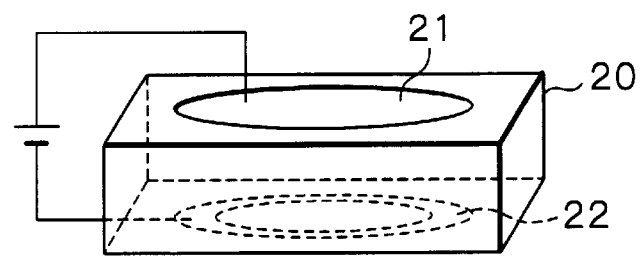
FIGS. 2a and 2b are oblique views schematically illustrating a plating device used in the embodiment of FIGS. 1a to 1i.
Figure 2B:
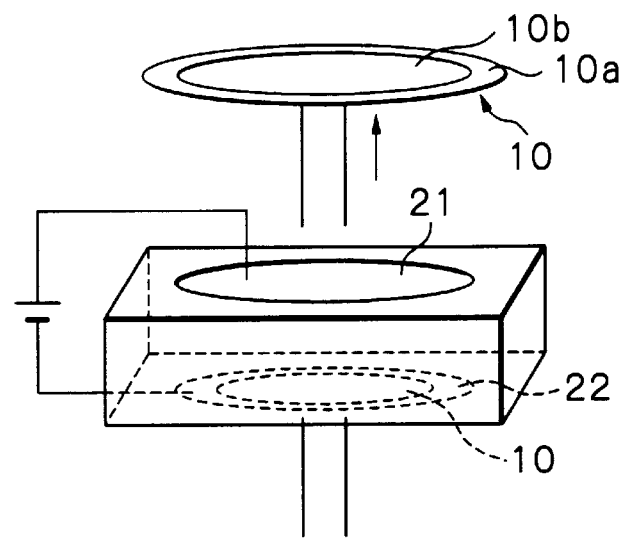
Figure 3A:
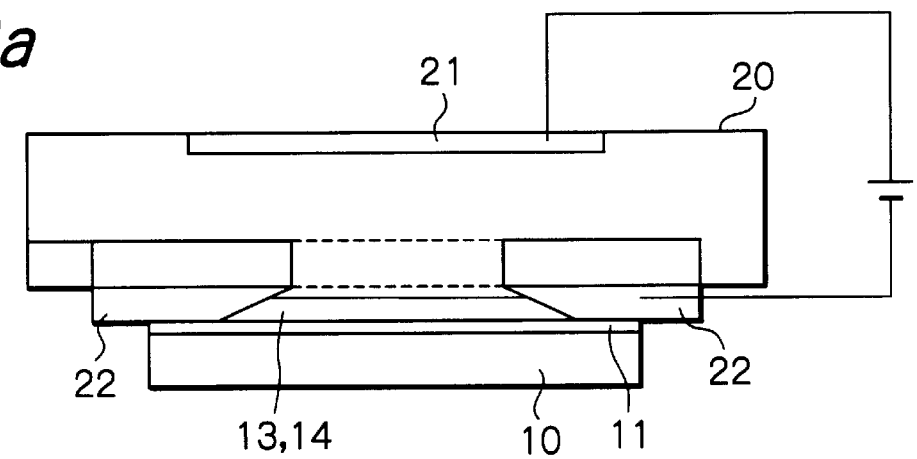
FIGS. 3a and 3b illustrate electrical contact between an electrode of the plating device and a conductive film formed on an wafer.
Figure 3B:
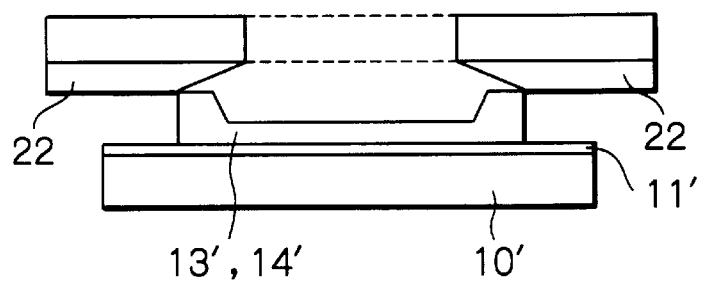

FIGS. 2a and 2b schematically illustrate the plating device used in this embodiment, and FIGS. 3a and 3b illustrate electrical contact between an electrode of the plating device and the conductive film formed on the wafer.

In FIGS. 2a and 2b, reference numeral 20 denotes a plating bath which will be filled with an electrolytic solution during plating, 21 an anode electrode formed in the bath 20, 22 a cathode electrode also formed in the bath 20, 10 the wafer, 10a the edge portion of the wafer 10 and 10b the resist layer portion of the wafer 10. In the edge portion 10a of the wafer 10, the conductive film 11 is exposed as a result of the aforementioned edge rinse. The resist layer portion 10b of the wafer 10 is covered by the first and second resist layers 13 and 14 except for the patterned openings.

As shown in FIG. 2a, the wafer 10 with the patterned resist layers is moved up and attached to the plating bath 20 so that the edge portion 10a of the wafer 10 electrically contacts the ring-shaped cathode electrode 22 as shown in FIGS. 2b and 3a. The cathode electrode 22 is formed such that its almost whole surface is covered by an insulation resin but a part of the bottom surface to which the edge portion 10a of the wafer 10 contacts is exposed. Therefore, after the wafer 10 is attached to the plating device, only the patterned openings of the resist layers are exposed to the plating bath.

If projections of first and second resist layers 13' and 14' are remained at the edge portion of a wafer 10' as shown in FIG. 3b, it is difficult to bring a conductive film 11' of the wafer 10' intimate contact with the cathode electrode 22. Thus, electrical conduction between the cathode electrode 22 and the conductive film 11' becomes unstable and therefore stable plating cannot be expected. Although it is possible to simultaneously remove the projections of the first and second resist layers 13' and 14' on the wafer 10' by the edge rinse method, if the width of the projections is wide, the removed area will become large and therefore the region for forming the elements on the wafer 10' will becomes small causing a utilization efficiencies of the wafer to reduce.

However, as executed in this embodiment, if the second resist layer 14 is formed after the edge portion of the formed first resist layer 13 is removed by the edge rinse, the projection 14a of the second resist layer 14 is formed on the wafer 10 where no first resist layer 13 is remained due to the edge rinse. Thus, the height of the projection of the resist layer becomes very low. Furthermore, if the edge rinse of the second resist layer 14 is performed such that the width w2 of the removed area is smaller than the width w1 of the removed area of the first resist layer 13, an extremely low projection height can be expected without increasing the whole width of the removed area of the resist layers. As a result, stable electrical conduction between the cathode electrode 22 and the conductive film 11 can be obtained and thus plating of conductive material can be attained at a stable plating rate without narrowing the region for forming the elements.

Figure 1I:
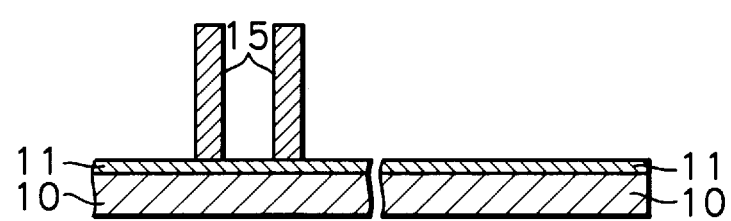

Thereafter, as shown in FIG. 1i, the conductor members 15 are obtained by removing the first and second resist layers 13 and 14.

In the aforementioned embodiment, the resist layer with a desired thickness is formed by coating the resist material twice. However, if generation of projection of the resist layer at a wafer edge portion is disregarded, it is possible to attain the object of the present invention by one coating process of the resist material.

Although the above-mentioned embodiment related to the method for forming conductor members, it is apparent that the present invention can be applied to a manufacturing method of a semiconductor element using this method for forming conductor members such as electrodes of the semiconductor element and to a manufacturing method of a thin-film magnetic head using this method for forming conductor members such as electrodes of the magnetic head.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method for forming conductor members comprising the steps of:

coating an organic solvent on a conductive film to form an organic solvent layer;

coating a resist material on said organic solvent layer to form a resist layer;

patterning said resist layer to form a patterned resist layer; and plating a conductive material using said patterned resist layer to form the conductor members.

2. The method as claimed in claim 1, wherein said organic solvent is composed of a solvent component of said resist material.

3. A manufacturing method of a semiconductor element comprising a step of forming electrodes using the method for forming conductor members as claimed in claim 1.

4. A manufacturing method of a thin-film magnetic head comprising a step of forming electrodes using the method for forming conductor members as claimed in claim 1.

5. A method for forming conductor members comprising the steps of:

coating an organic solvent on a conductive film to form an organic solvent layer;

coating a resist material on said organic solvent layer to form a first resist layer;

coating a resist material on said first resist layer to form a second resist layer;

patterning said first and second resist layers to form a patterned resist layers; and plating a conductive material using said patterned resist layers to form the conductor members.

6. The method as claimed in claim 5, wherein an edge portion of said first resist layer is removed by an edge rinse method before said second resist layer is formed, and wherein an edge portion of said second resist layer is removed by the edge rinse method before the plating.

7. The method as claimed in claim 6, wherein a width of the removed edge portion of said first resist layer is larger than a width of the removed edge portion of said second resist layer.

8. The method as claimed in claim 5, wherein said organic solvent is composed of a solvent component of said resist material.

9. A manufacturing method of a semiconductor element comprising a step of forming electrodes using the method for forming conductor members as claimed in claim 5.

10. A manufacturing method of a thin-film magnetic head comprising a step of forming electrodes using the method for forming conductor members as claimed in claim 5.

* * * * *